(12) United States Patent
Farrow

(10) Patent No.: US 8,212,570 B1
(45) Date of Patent: Jul. 3, 2012

(54) AMPLIFIER CIRCUIT FOR A CURRENT TRANSFORMER

(75) Inventor: John Foster Farrow, Plymouth, MI (US)

(73) Assignee: Welding Technology Corporation, Farmington Hills, MI (US)

( * ) Notice: Subject to any disclaimer, the term of this patent is extended or adjusted under 35 U.S.C. 154(b) by 505 days.

(21) Appl. No.: 12/437,627

(22) Filed: May 8, 2009

Related U.S. Application Data

(60) Provisional application No. 61/126,927, filed on May 9, 2008.

(51) Int. Cl.
*G01R 31/14* (2006.01)
*H02H 3/00* (2006.01)

(52) U.S. Cl. .......................... 324/509; 361/42

(58) Field of Classification Search ................ None
See application file for complete search history.

(56) References Cited

U.S. PATENT DOCUMENTS

| | | | | |
|---|---|---|---|---|
| 3,815,012 A | * | 6/1974 | Milkovic | ............... 323/357 |
| 4,076,996 A | * | 2/1978 | Maehara et al. | ............. 315/106 |
| 4,150,411 A | | 4/1979 | Howell | |
| 4,156,884 A | * | 5/1979 | Eckart et al. | ............... 361/46 |
| 4,198,595 A | * | 4/1980 | Milkovic | ............... 323/357 |
| 4,325,096 A | | 4/1982 | Sunohara et al. | |
| 4,870,532 A | * | 9/1989 | Beatty et al. | ............ 361/93.7 |
| 5,825,170 A | * | 10/1998 | Montreuil | ............... 323/355 |
| 6,608,492 B1 | * | 8/2003 | Entenmann | ............... 324/706 |
| 7,193,827 B2 | * | 3/2007 | Reid et al. | ............... 361/42 |

OTHER PUBLICATIONS

Application Note AN3428, Published Dec. 1, 2004 by Maxim Integrated Products, Inc. 120 San Gabriel Drive Sunnyvale, CA 94086 USA 408-737-7600. Can be downloaded from www.maxim-ic.com See Figure 3 and paragraph preceding.
Datasheet for TLV2462 operational amplifier, Publication SLOS220J, Published Feb. 2004 by Texas Instruments, PO Box 655303, Dallas, TX 75265. Can be downloaded from www.ti.com.

* cited by examiner

*Primary Examiner* — Jeff Natalini
(74) *Attorney, Agent, or Firm* — John Foster Farrow

(57) ABSTRACT

The invention is a simple amplifier circuit for a current transformer to measure very small AC currents, as required for ground fault detection. The circuit presents a very low impedance to the current transformer output and provides high amplification of the current transformer signal. Concurrently and with no additional components, the inventive circuit supplies a bias current to the current transformer to improve its performance and provides output signals which can be used to detect disconnection of the current transformer or a short circuit between either of the current transformer terminals and ground.

5 Claims, 2 Drawing Sheets

AMPLIFIER CIRCUIT FOR A CURRENT TRANSFORMER

CROSS REFERENCE TO RELATED APPLICATIONS

This application claims priority of U.S. Provisional Patent Application No. 61/126,927 filed on May 9, 2008 and titled "Amplifier Circuit for a Current Transformer", the entirety of which is incorporated herein by reference.

BACKGROUND OF THE INVENTION

In art, this invention is believed to be in Class 361, Subclass 42.

This invention relates to an amplifier circuit for a current transformer which has a low DC circuit impedance but a relatively high AC circuit impedance. Such current transformers approximate constant-current AC sources when operated at frequencies within their operating frequency range.

Normally, current transformers are used to measure fairly large AC currents, from one or two amperes up to 1000 or more amperes. A typical current transformer has a ratio in the range of 10:1 to 1000:1. Under these conditions, the output signal from the current transformer is quite large and amplification is unnecessary. However, in certain specialized applications, such as ground fault detection, it is necessary for current transformers to measure AC currents as small as 1 or 2 milliamperes. Under these conditions, amplification of the signal from the current transformer becomes necessary.

When using a current transformer to measure very small currents a difficulty arises from the characteristics of the current transformer itself. Current transformers are most accurate when terminated into a low impedance load; the lower the impedance the more the current transformer acts like an ideal transformer with a turns ratio that remains constant at all currents. This is especially true when attempting to measure very low currents. However, when trying to measure a very low current, with a very low impedance across the current transformer output, the resulting signal output is very, very small, and it must be amplified to bring it up to a useful value. With conventional amplifiers, this causes all sorts of problems with noise, amplifier drift and other effects which adversely affect the accuracy of the current measurement.

The object of the invention is an improved amplifier circuit which provides high amplification and presents a very low impedance to the signal source. An additional feature of the improved amplifier circuit is the ability to detect an open circuit or a short-circuit to ground in the current transformer or its associated wiring. When used in conjunction with an ordinary iron-core current transformer, this amplifier circuit allows accurate current measurements down to a fraction of a milliampere.

DETAILED DESCRIPTION OF THE PREFERRED EMBODIMENT

Figure 1:
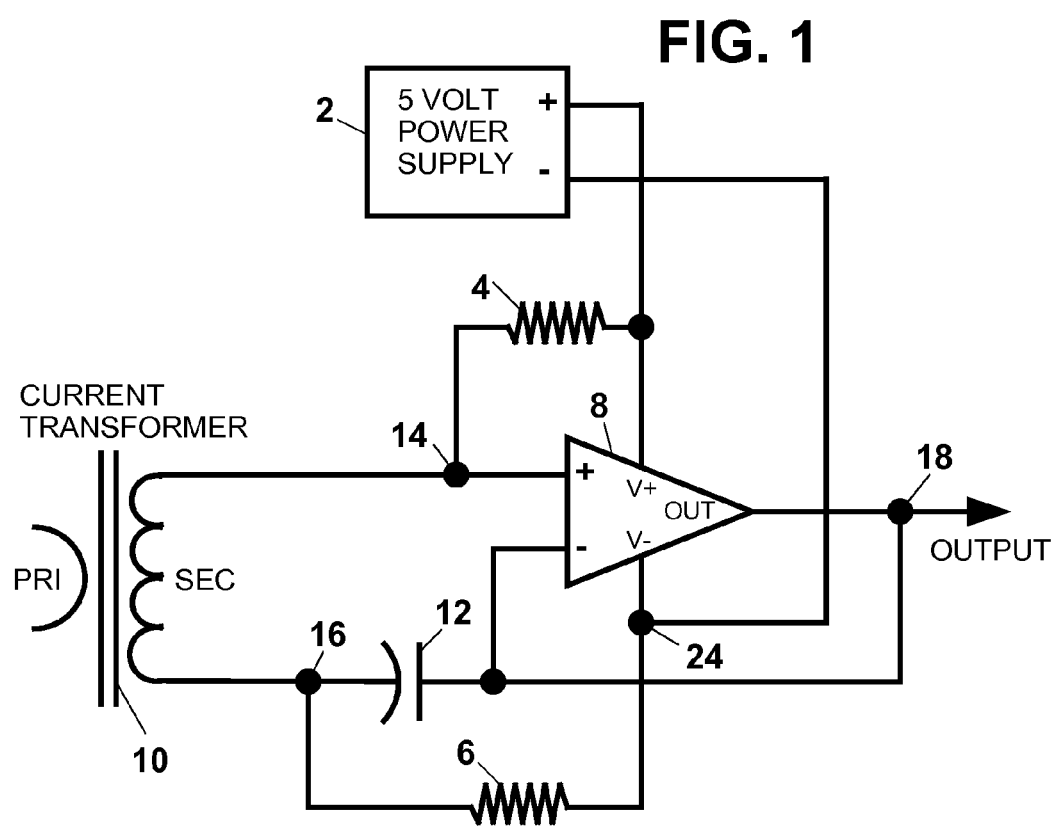
FIG. 1 shows a schematic drawing of the inventive circuit, with a current transformer attached.

A schematic diagram of the inventive amplifier circuit is shown in FIG. 1. In the preferred embodiment, the circuit is powered from power supply 2 which provides a regulated, stable, low noise 5 volts DC but any voltage within the operating requirements of operational amplifier 8 could be used. Unless otherwise noted, all voltages mentioned herein are in relation to the "−" terminal of power supply 2, identified as point 24 in FIGS. 1 and 2. The V+ terminal of amplifier 8 is the input for its positive power supply. The V− terminal of amplifier 8 is the input for its negative power supply. As shown in FIG. 1, amplifier 8 is connected to and powered from power supply 2.

The type of operational amplifier selected for amplifier 8 in FIG. 1 should have a very high input impedance and a low input bias current; amplifiers with FET input stages provide the best performance. The input offset voltage of the operational amplifier should not exceed +/−10 millivolts. In the preferred embodiment of this circuit, a commercially available type TLV2462 operational amplifier, manufactured by Texas Instruments, works very well, but there are many other types from many other manufacturers which are also suitable.

Operational amplifier 8 in FIG. 1 is connected in a unity-gain configuration, with the "−" input directly connected to the output. In normal circumstances, this configuration would result in unity gain, however the unique aspects of the rest of the circuit give both considerable gain to the output signal of the current transformer, 10, and present a very low impedance across points 14 and 16 located at the output of the current transformer.

Current transformer 10 in FIG. 1 is a current transformer specifically designed to measure small ground fault currents. Such a transformer is commonly called a "zero-phase current transformer". Such a transformer is described in U.S. Pat. No. 4,325,096 incorporated herein by reference. However, because of the extremely low impedance presented to the current transformer by the inventive circuit, most of the improvements described in the '096 patent are made unnecessary.

In the preferred embodiment, current transformer 10 in FIG. 1 is a toroidal type with 600 turns on the secondary winding. The primary, which is normally a cable with a pair of wires carrying equal currents in opposite directions, passes only once through the center of the toroidal core, and thus constitutes a single turn. In this configuration, the current transformer operates at a 600:1 ratio. The DC resistance of the secondary of a current transformer of this type is normally 10 ohms or less.

In the preferred embodiment, resistors 4 and 6 in FIG. 1 are both 20,000 ohm, 1% tolerance resistors. Because the DC resistance of current transformer 10 is less than 10 ohms, the voltage at point 14 which is the "+" input of operational amplifier 8 is almost exactly 2.5 volts. Thus the output of operational amplifier 8 is biased to one half of the supply voltage or 2.5 volts.

Normally, the value of capacitor 12 in FIG. 1 is selected so as to present a low impedance at the lowest frequency of the current which is to be sensed. In a circuit to measure 60 HZ powerline current, a desirable value of capacitor 12 is about 300 microfarads, which results in an impedance, $Z_c$, of approximately 9 ohms at 60 HZ. The main purpose of capacitor 12 in FIG. 1 is to block positive DC feedback through the secondary of current transformer 10 to the "+" input of the amplifier. Referring to FIG. 1, if capacitor 12 were replaced with a short circuit, with a 20,000 ohm value for resistor 4 and with a 10 ohm value for the secondary of current transformer 10, this positive feedback would result in a voltage gain of about 2000 at DC. A 2 millivolt offset voltage between the "+" and "−" inputs of amplifier 8 would then be amplified by 2000 times to result in saturation of the output of amplifier 8 to either +5V or 0V, depending on the polarity of the input offset voltage, thus rendering the amplifier circuit inoperative. With capacitor 12 connected as shown in the circuit, the input offset voltage of amplifier 8 is not amplified and an input offset voltage up to ten millivolts causes no problems at all.

A key point to understanding the amplifier circuit of FIG. 1 is that the input voltage at point 14 and the output voltage at point 18 track each other very, very closely, as expected for a unity gain amplifier. Assuming an open-loop gain of 30,000 for operational amplifier 8 (typical for a TLV2462 part), the voltage at point 18 will be equal to (1−1/30,000)=0.99996666 times the voltage at point 14. Thus if point 14 is at 2.5 volts in relation to the "−" terminal of power supply 2, then point 18 will be at 2.49991667 volts in relation to the "−" terminal of power supply 2. This represents an error of about 0.0035%, small enough to be ignored in the remaining discussion.

In the discussion herein, all voltages are taken in reference to the "−" terminal of power supply 2, unless otherwise noted.

At rest, with no signal coming from current transformer 10 in FIG. 1, the voltage at point 14 is 2.5VDC and the output signal at point 18 is a steady 2.5VDC.

In the preferred embodiment, current transformer 10 of FIG. 1 has 600 turns and is wound on a toroidal core. The wire(s) on which current is to be measured pass through the hole in the middle of the toroidal core to form the single-turn primary winding of the current transformer. Because the ratio of the current transformer is 600:1, that means that each ampere flowing in the primary results in 1/600 ampere (1.666 milliampere) in the secondary of current transformer 10. If the net current flowing in the primary of current transformer 10 is 1 milliampere (typical for ground fault detection systems), this would result in 1/600 milliampere (1.666 microamperes) in the secondary of current transformer 10.

If 1.666 microamperes of current at 60 HZ is flowing in the secondary of current transformer 10, it is also flowing in resistor 4, which is in series with the current transformer. Because the "+" input of operational amplifier 8 has a very high impedance (typically 1000 Megohms for a FET input), essentially all of the current will flow through resistor 4.

1.666 microamperes of AC current in 20,000 ohms generates an AC voltage of 33.33 millivolts at point 14. Since the output of the operational amplifier, point 18 tracks input point 14 this will result in 33.3 millivolts AC of output signal.

But, referring to FIG. 1, since the other end of current transformer 10, point 16, is connected through capacitor 12 to the output of the operational amplifier, point 18, the voltage at point 16 also follows point 14 very closely. Thus the voltage across current transformer 10 is held to almost zero, which corresponds to a very low value of impedance across the current transformer. In operation, the effective value of impedance presented across the terminals of the current transformer is equal to twice the impedance of capacitor 12 at whatever frequency of current is being measured, plus, in series, the value of resistor 4 divided by the open loop gain of amplifier 8 at the frequency of operation. At 60 HZ, with a value of 300 microfarads for capacitor 12, the effective impedance across points 14 and 16 is 18 ohms capacitive with 20,000 ohms/30,000 gain=0.666 ohms in series.

Thus, with the amplifier circuit shown in FIG. 1, the voltage which appears across the secondary of current transformer 10 is about 30 microvolts per milliampere of current in the primary. This extraordinarily low voltage means that the magnetic flux in the core of current transformer 10 is held to a very low value, thus avoiding the problems caused by the magnetic permeability of the iron core changing due to changes in the magnet flux density.

It is interesting to compare the performance of the amplifier circuit shown in FIG. 1 with the prior art. If current transformer 10 in FIG. 1 was connected to an 18 ohm burden resistor, to obtain an output voltage of 30 microvolts per milliampere of measured current, then an amplifier with a voltage gain of 1100 would be required to obtain the same output signal as the circuit of FIG. 1. Instead, the arrangement of the circuit as in FIG. 1 allows an ordinary operational amplifier in a unity-gain configuration to deliver the required amplification without the problems usually associated with high-gain amplifiers.

Although the presence of capacitor 12 in the circuit of FIG. 1 allows the voltage across current transformer 10 to be maintained at a very low level for improved accuracy, the effectiveness of capacitor 12 decreases with decreasing frequency. As the frequency of the signal being measured goes down, the reactive impedance across capacitor 12 goes up and so does the voltage drop across it. This voltage drop across capacitor 12 causes the voltage at point 16 to be different than the voltage at points 18 and 14, thus causing the voltage across the current transformer to increase, which reduces its accuracy. However, the described circuit works quite well so long as capacitor 12 is sized large enough so the voltage drop across it is low at the lowest frequency of operation, which is usually the 50 or 60 HZ powerline frequency. In practice, iron core current transformers are not well suited to measuring very low frequency currents anyway, so the low frequency limitations of the amplifier circuit of FIG. 1 caused by capacitor 12 are not serious.

Increasing the capacitance value of capacitor 12 in FIG. 1 to an extremely large value brings problems along with only slightly lower impedance presented to current transformer 10. In operation, the voltage across capacitor 12 is approximately equal to the input offset voltage of the operational amplifier. Upon power-up, capacitor 12 must be charged, through resistors 4 and 6 to whatever this voltage is. If capacitor 12 is extremely large, this charging may take many seconds, causing the output of the amplifier to be inaccurate. Also, the leakage current of capacitor 12 must be several orders of magnitude lower than the current flowing through resistors 4 and 6 in order to avoid introducing error due to leakage current. With extremely large capacitance values, particularly with electrolytic capacitors, leakage current may be a problem, especially at high operating temperatures. In general, increasing the value of capacitor 12 to attain impedances significantly lower than the DC resistance of current transformer 10 at the lowest desired operating frequency brings very little improvement in current measurement accuracy while opening the door to other problems.

The output level ("gain") of the circuit for a given input signal is adjusted by changing the value of resistor 4. A higher resistance makes higher output, a lower resistance makes lower output, in direct proportion to resistance. In most cases, resistor 6 is made the same value as resistor 4 so that the output of the operational amplifier is centered between the "+" and "−" terminals of the power supply to allow symmetrical amplification of AC signals.

The arrangement of resistors 4 and 6 in the circuit of FIG. 1 puts a DC bias current of about 0.125 milliamperes through the secondary of current transformer 10. This current, acting through the 600 turns of the secondary of current transformer 10, biases its iron core away from the zero magnetic state. Since most types of transformer iron used for the cores of current transformers exhibit maximum magnetic permeability at magnetic flux densities away from zero, this magnetic biasing of the core of current transformer 10 results in more accurate measurement of very low currents due to a higher effective magnetic permeability of the core. In most cases, the need for specialized and expensive core materials for current transformer 10, which have high magnetic permeability at zero magnetic flux density, such as mu-metal or amorphous iron, are eliminated.

If a particular value of DC bias current through current transformer 10 in FIG. 1 is needed, the value of resistors 4 and 6 may be altered to achieve it. However, since this affects the gain of the amplifier circuit, a following attenuator or amplifier may be necessary to achieve the desired signal output level.

The circuit as shown in FIG. 1 also has another desirable characteristic. If current transformer 10 or the wiring to it loses continuity, the voltage at point 14 will go to +5 volts and the output at point 18 will go to the maximum positive value that operational amplifier 8 can attain. Since in normal operation the output of the amplifier circuit is an AC signal, centered at ½ of the power supply voltage, not a DC voltage close to the positive power supply voltage, this allows quick and easy detection of a broken or disconnected current transformer.

Figure 2:
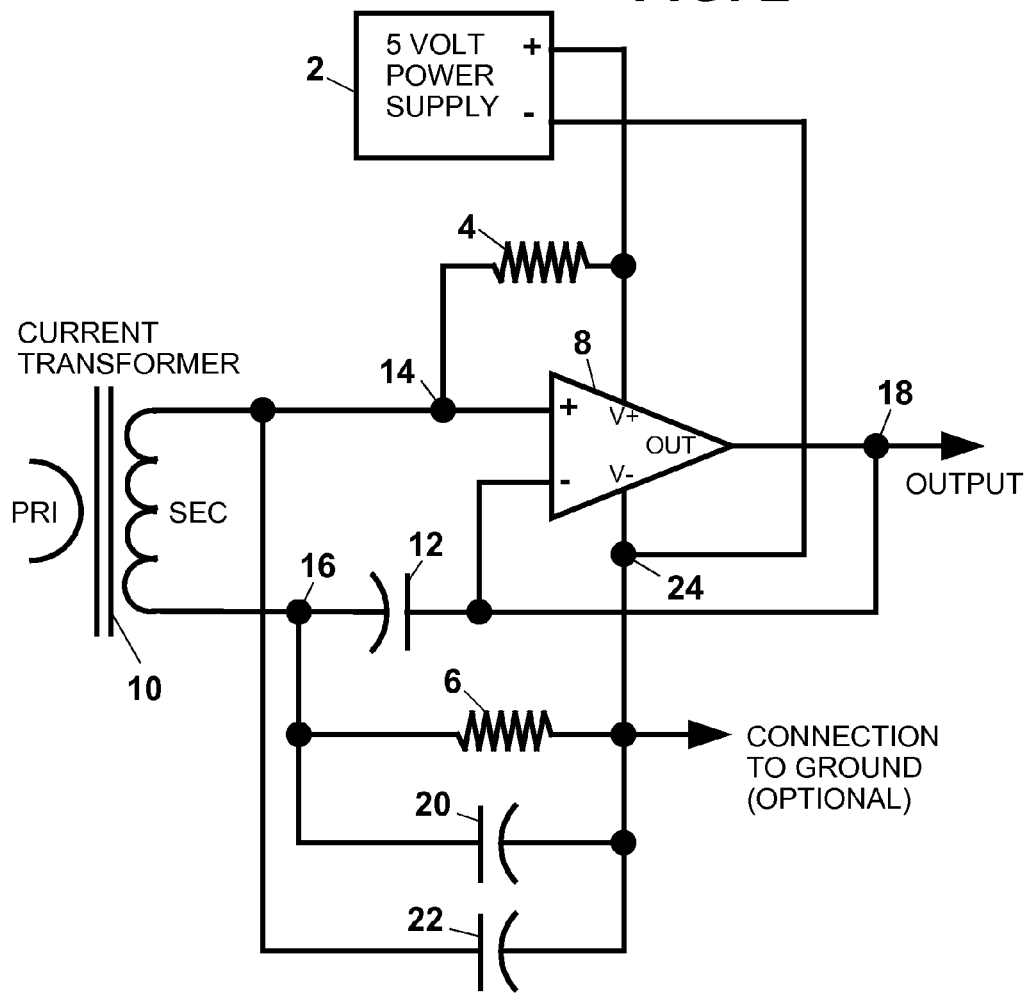
FIG. 2 shows some variations of the circuit of FIG. 1.

In a typical application, the "−" terminal of power supply 2 is connected to safety or case ground as illustrated in FIG. 2. In such a system, a short-circuit to ground at either terminal of the current transformer will cause the voltage at points 14 and 16 to go to zero and the voltage at point 18 to go as close to zero as operational amplifier 8 can attain. Since in normal operation the output of the amplifier circuit is an AC signal, centered at ½ of the power supply voltage, not a DC voltage close to zero, this allows quick and easy detection of a short-circuit to ground in the wiring to the current transformer or in the current transformer itself.

Another desirable characteristic can be obtained by selecting a different value for capacitor 12 in FIG. 1. Instead of selecting the value of capacitor 12 to obtain low impedance at the lowest desired operating frequency, the capacitance value is selected so as to be series resonant with the self-inductance of the current transformer 10 at a desired frequency. Depending on the characteristics of the current transformer and the selected capacitor, this can be used to make the output voltage at point 18 much greater at a desired frequency and much less at other frequencies. This allows selective sensing of AC currents by frequency. However, the accuracy of current measurement is compromised because the output of current transformer 10 is affected by relatively small changes of capacitance of capacitor 12. Stable values of capacitance over time and temperature are difficult to attain.

If the current transformer 10 in FIG. 1 must be mounted at considerable distance from the amplifier, thus requiring a long interconnecting cable, or if the conductor(s) on which ground fault current is to be sensed are carrying switched currents with a significant high-frequency component, there may be some capacitive coupling of high-frequency transients or noise into the amplifier circuit. This can be reduced with a pair of capacitors 20 and 22 connected as shown in FIG. 2. A typical value for capacitors 20 and 22 of FIG. 2 is 1000 picofarads. For best results, capacitors 20 and 22 should be approximately the same value, but precise matching is not necessary. Assuming that the reactance of these capacitors is two orders of magnitude higher the resistance of resistor 4 at the desired operating frequency, the amplification of the circuit is reduced by less than 1%. The added capacitors, regardless of size, do not create any tendency to oscillation in the amplifying circuit.

Because of its unity-gain configuration and the self-inductance characteristics of the current transformer, the inventive circuit has no tendency to oscillation at higher frequencies. The effective gain at high frequencies is reduced by the increasing $Z_L$ of the current transformer as frequency increases. In empirical testing with a typical current transformer, the inventive circuit exhibits an overdamped response to a square-wave signal.

Although the specifics of a preferred embodiment have been used to illustrate how the inventive circuit works, it is to be understood that there are many, many variations and applications of the inventive circuit which fall within the scope of the invention. The amplifier is useful with almost any type of passive sensor which has a low DC resistance between its terminals. For example, the inventive amplifier circuit with a high-frequency operational amplifier could be used to amplify the output of a loop-type antenna to measure radio signals. The extremely low impedance presented by the amplifying circuit to the loop antenna would reduce detuning effects due to surrounding objects and allow more accurate field strength measurements. The scope of the invention is extremely broad and is limited only by the appended claims.

I claim:

1. An amplifier circuit with a current transformer connected to its input consisting of:
   a. a DC power supply with positive and negative output terminals, and
   b. an operational amplifier, powered by the DC power supply, with its negative input connected directly to its output, and
   c. the first terminal of the current transformer connected to the positive input of the operational amplifier, and
   d. a first resistor connected between the positive input of the operational amplifier and the positive terminal of the power supply, and
   e. the second terminal of the current transformer connected to the first terminal of a capacitor, and
   f. the second terminal of the capacitor connected to the output of the operational amplifier, and
   g. a second resistor connected between the second terminal of the current transformer and the negative terminal of the power supply.

2. The amplifier circuit of claim 1 wherein the component values are selected so as to present an impedance of less than 20 ohms across the terminals of the current transformer at a desired operating frequency and amplify the voltage across the current transformer terminals by more than 1000 times.

3. The amplifier circuit of claim 1 wherein the component values are selected so as to apply a preselected amount of DC bias current through the current transformer.

4. An amplifier circuit with a current transformer connected to its input consisting of:
   a. a DC power supply with positive and negative output terminals, and
   b. an operational amplifier, powered by the DC power supply, with its negative input connected directly to its output, and
   c. the first terminal of the current transformer connected to the positive input of the operational amplifier, and
   d. a first resistor connected between the positive input of the operational amplifier and the positive terminal of the power supply, and
   e. the second terminal of the current transformer connected to the first terminal of a first capacitor, and
   f. the second terminal of the first capacitor connected to the output of the operational amplifier, and
   g. a second resistor connected between the second terminal of the current transformer and the negative terminal of the power supply, and
   h. a second capacitor connected between the first terminal of the current transformer and the negative terminal of the power supply, and i. a third capacitor connected between the second terminal of the current transformer and the negative terminal of the power supply, wherein the values of the second and third capacitors are chosen so as to have an impedance at least an order of magnitude higher than the first resistor at the desired operating frequencies of the amplifier.

5. An amplifier circuit with a current transformer connected to its input consisting of:
   a. a DC power supply with positive and negative output terminals, with the negative output terminal connected to ground, and
   b. an operational amplifier, powered by the DC power supply, with its negative input connected directly to its output, and
   c. the first terminal of the current transformer connected to the positive input of the operational amplifier, and
   d. a first resistor connected between the positive input of the operational amplifier and the positive terminal of the power supply, and
   e. the second terminal of the current transformer connected to the first terminal of a capacitor, and
   f. the second terminal of the capacitor connected to the output of the operational amplifier, and
   g. a second resistor connected between the second terminal of the current transformer and the negative terminal of the power supply, wherein the component values are selected so as to cause the output of the amplifier to go to a known and constant DC value if either terminal of the current transformer becomes connected to ground.

\* \* \* \* \*